United States Patent
Oakley et al.

(10) Patent No.: US 7,145,282 B2
(45) Date of Patent: Dec. 5, 2006

(54) ACTUATOR

(75) Inventors: Charles Dale Oakley, Davison, MI (US); Rick Daniel Kerr, Fenton, MI (US); Giulio Angel Ricci-Ottati, Burton, MI (US); Russell Harmon Bosch, Gaines, MI (US); Hermann Breitbach, Crauthem (LU); Manfred Kolkman, Messancy (BE)

(73) Assignee: Delphi Technologies, Inc., Troy, MI (US)

( * ) Notice: Subject to any disclaimer, the term of this patent is extended or adjusted under 35 U.S.C. 154(b) by 209 days.

(21) Appl. No.: 10/891,690

(22) Filed: Jul. 15, 2004

(65) Prior Publication Data

US 2006/0012266 A1    Jan. 19, 2006

(51) Int. Cl.
*H01L 41/083* (2006.01)
*H01L 41/053* (2006.01)

(52) U.S. Cl. .................. 310/344; 310/328; 310/348
(58) Field of Classification Search ............ 310/311, 310/328, 340, 344, 348
See application file for complete search history.

(56) References Cited

U.S. PATENT DOCUMENTS

| | | | | |
|---|---|---|---|---|
| 4,471,256 A | * | 9/1984 | Igashira et al. | 310/328 |
| 4,803,393 A | * | 2/1989 | Takahashi | 310/328 |
| 5,205,147 A | * | 4/1993 | Wada et al. | 72/429 |
| 5,359,252 A | * | 10/1994 | Swift et al. | 310/328 |
| 5,986,386 A | * | 11/1999 | Jaenker | 310/340 |
| 6,274,967 B1 | * | 8/2001 | Zumstrull et al. | 310/328 |
| 6,291,929 B1 | * | 9/2001 | Heinz et al. | 310/328 |
| 6,326,717 B1 | * | 12/2001 | Mattes | 310/328 |
| 6,333,586 B1 | * | 12/2001 | Polach et al. | 310/328 |
| 6,499,471 B1 | * | 12/2002 | Shen et al. | 123/498 |
| 6,685,113 B1 | * | 2/2004 | Ruehle et al. | 239/585.1 |
| 6,698,072 B1 | * | 3/2004 | Stier et al. | 29/25.35 |
| 6,700,308 B1 | * | 3/2004 | Heinz | 310/328 |
| 6,739,423 B1 | * | 5/2004 | Tashiro et al. | 181/105 |
| 6,984,924 B1 | * | 1/2006 | Voigt et al. | 310/348 |
| 2002/0084723 A1 | * | 7/2002 | Kawazoe | 310/348 |
| 2004/0046060 A1 | | 3/2004 | Maurer | |
| 2004/0069963 A1 | | 4/2004 | Mattes et al. | |
| 2004/0174096 A1 | | 9/2004 | Lux et al. | |

FOREIGN PATENT DOCUMENTS

| | | | | |
|---|---|---|---|---|
| DE | 3922504 A1 | * | 6/1990 | 310/311 |
| DE | 10139550 | | 3/2003 | |
| EP | 0977285 | | 2/2000 | |
| JP | 58-218183 | * | 12/1983 | 310/311 |

* cited by examiner

*Primary Examiner*—Thomas M. Dougherty
(74) *Attorney, Agent, or Firm*—David P. Wood (57) ABSTRACT

An actuator includes a piezoelectric stack within a housing that applies a compressive load to the stack. The housing may include a cylindrical tube closed at one end and may seal the stack against fluid pressure. The housing may be shorter than the length of the piezoelectric stack and may include resilient means for inducing elastic strain in the stack. The resilient means may include one or more slots extending around the circumference of the housing and/or a corrugated region of the housing to form a tension spring at a lower end of the housing. The tension spring may then serve to draw the stack into compression. The stack may include a plurality of layers of piezoelectric or piezoceramic material interspersed with a plurality of layers of electrically conductive material and connecting means for connecting the layers to a source of electrical power.

18 Claims, 5 Drawing Sheets

ACTUATOR

TECHNICAL FIELD

The present invention relates to an actuator for a fuel injector or like device for the delivery of fuel to a combustion space of an internal combustion engine. More particularly, the invention relates to a piezoelectric actuator for use with such fuel injectors. The invention also relates to a fuel injector incorporating a piezoelectric actuator.

BACKGROUND OF THE INVENTION

Fuel injectors for delivering predetermined quantities of fuel into a combustion space of an internal combustion engine or the like generally comprise a piston which is moveable within an internal bore of the injector in order to control the pressure of fuel contained within a control chamber of the injector. The control chamber is defined, in part, by a surface associated with a valve needle such that changes in fuel pressure within the chamber effect movement of the valve needle, thereby causing delivery of the fuel into the combustion space of the engine.

It is known to provide such fuel injectors with piezoelectric actuators for controlling movement of the piston within the bore. Such actuators generally consist of a piezoelectric body in the form of a multi-layer laminate or "stack" having layers of piezoelectric or piezoceramic material separated by metal or electrically conductive layers acting as electrodes.

The piezoelectric actuator is arranged to convert electrical energy into mechanical or kinetic energy such that an electrical voltage applied to the electrodes causes the piezoelectric material to expand or contract, in dependence on the magnitude and polarity of the voltage applied, thereby changing the effective length of the stack. The change in length of the stack effects movement of the control piston within the injector so as to open and close the valve needle.

It is known that the amount of compressive load applied to the piezoelectric stack can significantly influence actuator performance and durability. More specifically, the piezoelectric or piezoceramic material from which the piezoelectric stack is formed is capable of withstanding compressive stress but cannot withstand significant tensile stress. It is therefore advantageous to ensure that a compressive load on the stack is maintained throughout the operating cycle of the injector.

In known actuator arrangements, the compressive load applied to the piezoelectric stack is provided solely by the hydrostatic pressure of the fuel contained within an accumulator volume within which the stack is located. An actuator of this type is described in our co-pending, published European patent application, EP 0995901 A. However, during the operating cycle of the injector, it has been found that the hydrostatic pressure of the fuel can vary significantly, to the extent that the compressive load on the stack may drop below that needed for acceptable actuator durability.

Accordingly, it would be advantageous to have a system and method for maintaining a predetermined or minimum compressive load on the stack substantially throughout the operating cycle of the actuator.

SUMMARY OF THE INVENTION

It is an aim of the present invention to address these and other deficiencies in the prior art. It is a further aim of the invention to provide an actuator, which maintains a predetermined or minimum compressive load on the stack substantially throughout the operating cycle of the actuator.

According to one aspect of the present invention, therefore, there is provided an actuator for a fuel injector, the actuator comprising a piezoelectric stack disposed within a housing, wherein the housing is arranged to apply a compressive load to the piezoelectric stack.

Advantageously, the compressive load is applied to the piezoelectric stack substantially throughout the operating cycle of the actuator, thereby improving actuator performance and durability. The use of the housing to provide the compressive load on the piezoelectric stack reduces actuator complexity and component number and provides an effective, consistent and reliable pre-loading force on the stack.

In one embodiment, the housing comprises a generally cylindrical tube, the tube being closed at one end thereof.

The piezoelectric stack may consist of a plurality of layers of piezoelectric or piezoceramic material, interspersed with a plurality of layers of electrically conductive material. The piezoelectric stack may additionally include connecting means for connecting the layers of electrically conductive material to a source of electrical power. In a preferred embodiment, the layers of piezoelectric or piezoceramic material are each separated by a layer of electrically conductive material.

In one embodiment, the connecting means comprises a cap or top seal which is fixed to one end of the piezoelectric stack. The top seal may include one or more electrodes for connecting the stack to the source of electrical power.

The top seal may be formed from a ceramic material and bonded to one end of the piezoelectric stack. In this case, the top seal may include a casing surrounding, or partially surrounding, the ceramic material, the casing being formed from a metal material. Alternatively, the top seal may be formed from a metal material and bonded or welded to one end of the piezoelectric stack.

In one embodiment, the housing includes a radially outwardly directed lip or rim disposed circumferentially around an open end thereof.

Advantageously, the housing has a length which is shorter than the natural length of the piezoelectric stack by a predetermined amount x.

In one embodiment, the actuator further comprises clamping means for clamping the radially outwardly directed lip to the top seal. In clamping the lip to the top seal, the housing is stretched over the piezoelectric stack thereby to induce an elastic strain in the housing so as to apply the compressive load to the piezoelectric stack.

The clamping means may comprise a collar which has a radially inwardly directed rim or lip for engagement with the radially outwardly directed lip, said clamping means further comprising means for fixing the collar to the top seal thereby to clamp the housing to the top seal.

In one embodiment, the means for fixing comprises a surface for welding the collar to the top seal. Alternatively, an external surface of the top seal may include or define a screw thread and the means for fixing may comprise a corresponding threaded portion disposed on an internal surface of the collar for threaded engagement with the screw thread.

The amount or magnitude of elastic strain induced in the housing may be varied by varying the predetermined distance x. Alternatively, or in addition, the housing may be provided with resilient means for inducing a predetermined elastic strain in the housing. In one embodiment, the resilient means comprises one or more slots extending partially around the circumference of the housing. The resilient means may additionally, or alternatively, comprise a corrugated region.

Preferentially, the corrugated region forms a tension spring at a lower end of the housing and the stack is provided with an end piece which projects through the housing at the lower end thereof so that the tension spring serves to compress the stack. The end piece in connection with the stack can be formed with a reduced diameter, compared with that of the stack, and thus additional space is made available to accommodate the tension spring of the housing.

In a preferred embodiment, the housing additionally provides an encapsulant for the stack to seal the stack against fluid pressure, in use. This enables the actuator to be implemented in a fuel injector, in which the piezoelectric stack is located within a fluid-filled accumulator volume (for example, a fuel-filled accumulator volume) to apply hydrostatic compression to the stack.

According to a second aspect of the invention, there is provided a piezoelectrically operable fuel injector for use in an internal combustion engine, the fuel injector including an accumulator volume for pressurised fluid and an piezoelectric actuator of the aforementioned type, wherein the piezoelectric actuator has a piezoelectric stack located within the accumulator volume.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example only, with reference to the accompanying drawings in which.

DESCRIPTION OF THE EXEMPLARY EMBODIMENTS

Figure 1:
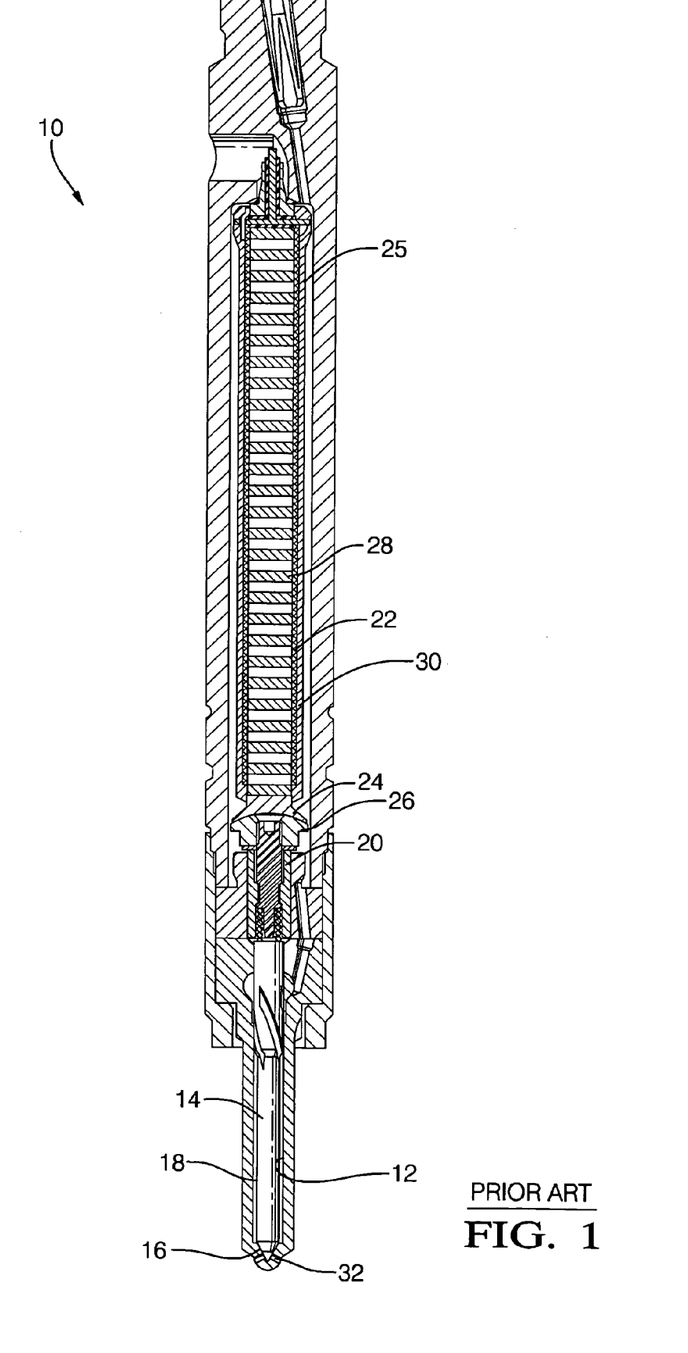
FIG. 1 illustrates a known fuel injector incorporating a piezoelectric actuator.

Referring firstly to FIG. 1, a known form of fuel injector for delivering a supply of fuel to a combustion space of an internal combustion engine or the like is shown generally at 10.

The injector 10 comprises a blind bore 12 having a valve needle 14 slidably disposed therein. The needle 14 is arranged to engage with a seating 16 defined adjacent to the blind end of the bore 12 and includes a region of reduced diameter which defines, together with the bore 12, an annular delivery chamber 18. Movement of the needle 14 within the bore 12 is controlled by the pressure of the fuel within the delivery chamber 18 and also by the position of a control piston 20 which couples to an upper end of the valve needle 14.

The position of the control piston 20 is controlled by a piezoelectric actuator 22 to which it is connected via an anvil member 24 and load transmitting member 26. The piezoelectric actuator has an actuator body in the form of a multi-layer laminate or stack having a plurality of piezoelectric or piezoceramic layers 28 which are interspersed (i.e. separated) by metal or other electrically conducting layers 30 acting as electrodes. The piezoelectric stack is located within an accumulator volume 25 filled with high pressure fuel. It will be appreciated that the size of the layers 28 shown in the drawing in FIG. 1 is enlarged for clarity of illustration.

In use, a reduction in the voltage applied to the electrodes 30 causes the actuator stack 22 to shorten in length, thereby reducing the downward pressure on the control piston 20, and hence the valve needle 14, such that at a predetermined time the pressure of fuel within the delivery chamber 18 is sufficient to lift the valve needle 14 from its seating thereby to deliver fuel from the injector, through a plurality of outlet openings 32 and into the combustion space of the engine.

This type of fuel injector is well known and its method of operation will be well understood by the skilled artisan. Furthermore, the piezoelectric actuator 22 is known to be a reliable and effective drive member for controlling the movement of the piston 20 and, hence, the valve needle 14.

However, it has been found that the presence, or absence, of a compressive load on the stack can have a significant effect on the durability of the actuator. Specifically, the piezoelectric stack 22 must not be subjected to significant tensile forces and, ideally, should be maintained in compression throughout its operating cycle for maximum durability. This is because the ceramic materials making up the piezoelectric layers can withstand relatively high compressive stresses but cannot withstand significant tensile stresses. In the piezoelectric actuator 22 of FIG. 1, for example, the only significant compressive force acting upon the piezoelectric actuator is that of the hydrostatic pressure of the fuel within the accumulator volume 25.

Figure 2:
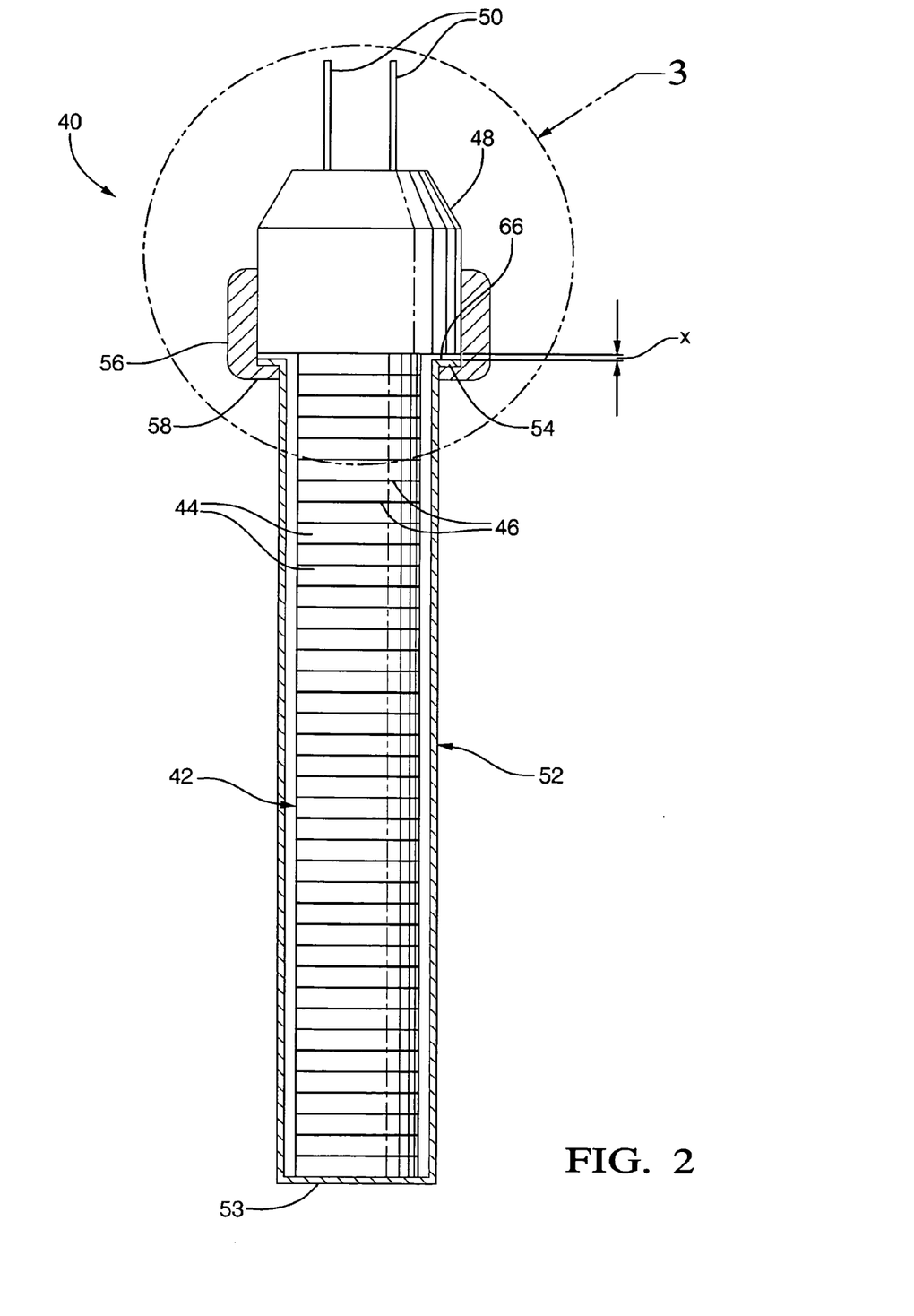
FIG. 2 shows a section through a piezoelectric actuator embodying a first form of the invention in a partially assembled state.
Figure 3:
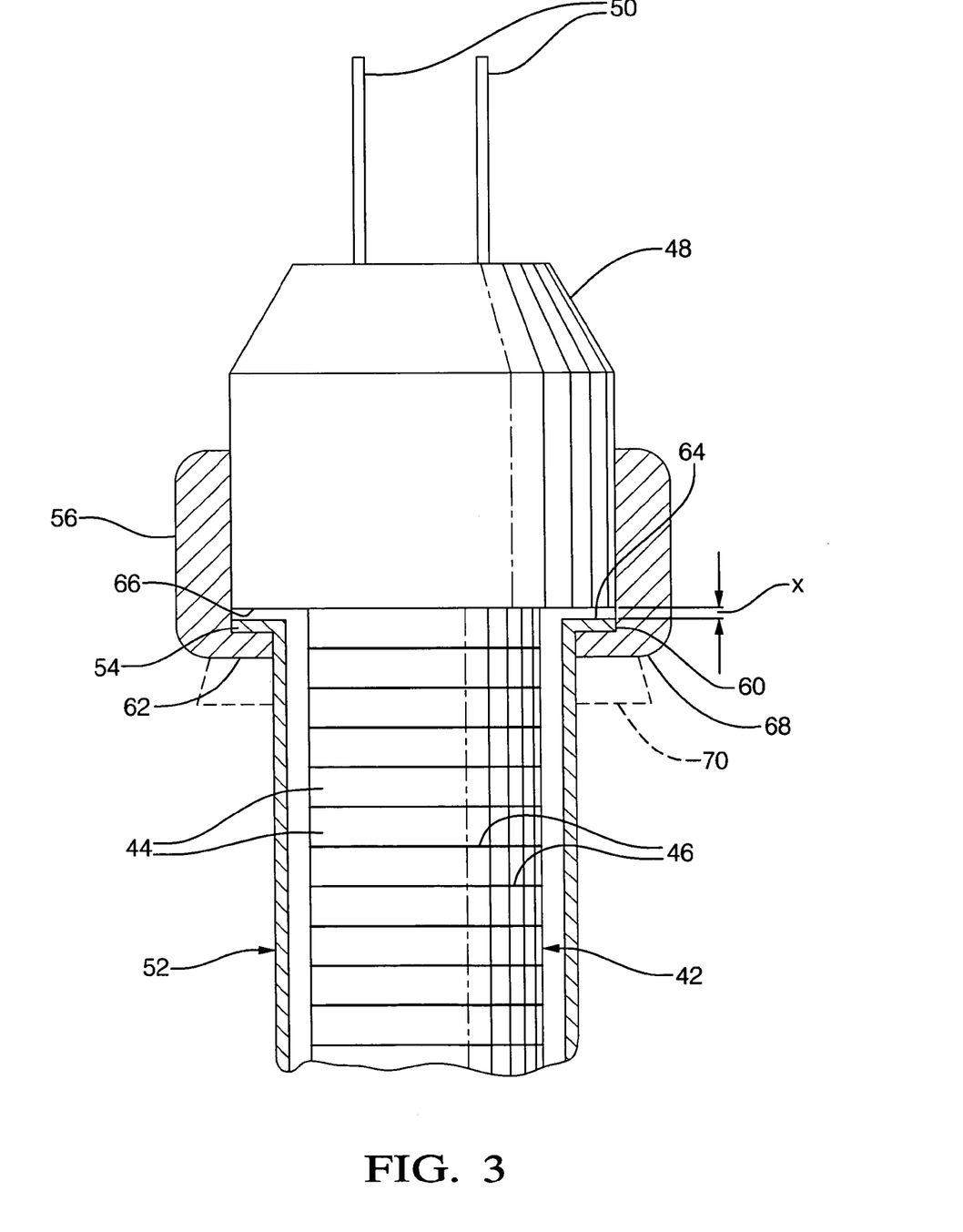
FIG. 3 is an enlargement of part of the actuator of FIG. 2.

Referring now to FIGS. 2 and 3, a piezoelectric actuator embodying a first form of the invention is shown generally at 40. The actuator arrangement is suitable for use in a fuel injector of the type illustrated in FIG. 1 and may take the place of the actuator 22. In the illustrated embodiment, the fuel injector proper is not shown.

The actuator 40 consists of a piezoelectric actuator stack 42 comprising a plurality of piezoelectric or piezoceramic layers 44 which are alternately bonded to, and separated by, respective electrically conductive layers 46. A cap portion 48, generally referred to as a "top seal", of greater diameter than the stack 42, is fixedly bonded to one end of the stack. The top seal 48 includes a pair of electrodes 50, electrically connected to the conductive layers 46 of the stack 42, for connecting the stack 42 to a source of electrical power (not shown).

The actuator also includes a housing 52 in the form of a generally cylindrical tube which is closed at one end 53 thereof and open at the opposite end. The housing 52, which may be formed from a metallic material, has a length which is shorter than the natural length of the piezoelectric actuator stack 42 (i.e. the length of the stack 42 when no electrical voltage is applied thereto) by a predetermined amount x. This predetermined distance x may be selected as desired, as described below, but is usually relatively small, for example 0.0005m–0.002m.

The open end of the cylindrical housing 52 is provided with a radially outwardly directed lip or flange 54 extending around the circumference of the housing 52. In the illustrated embodiment, the outer diameter of the lip 54 is substantially equal to the outer diameter of the top seal 48.

The actuator 40 also includes clamping means in the form of a generally annular retention collar 56. One edge of the retention collar 56 is provided with a radially inwardly directed lip 58 or flange extending around the inner circumference of the collar. The lip 58 has a minimum internal diameter which is not less than the outer diameter of the housing 52, while the inner diameter of the collar 56 proper is not less than the outer diameter of the outwardly directed lip 54 and the outer diameter of the top seal 48.

Figure 4:
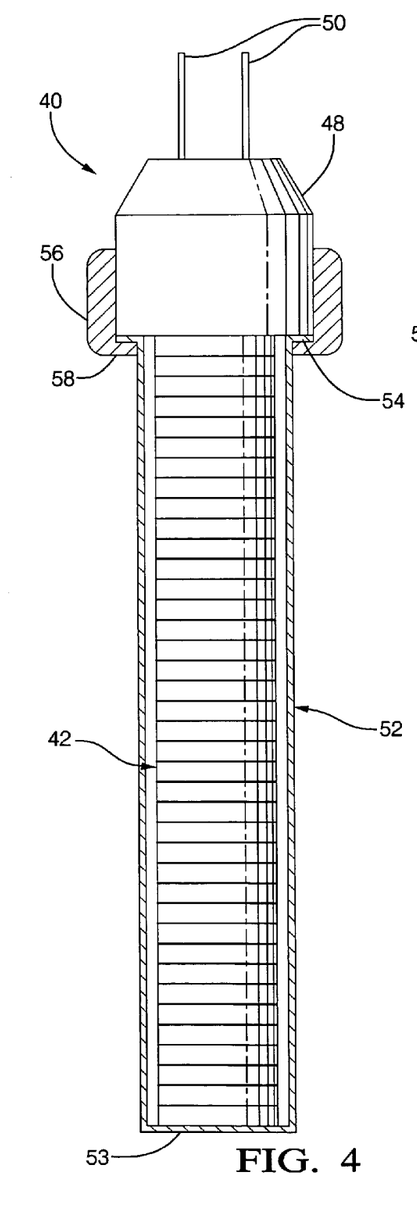
FIG. 4 illustrates a section through the piezoelectric actuator of FIG. 2 in a fully assembled state.

To assemble the actuator, the collar 56 is slid over the housing 52, from the closed end 53 towards the open end until the upper surface 60 of the radially inwardly directed lip 58 on the collar 56 abuts with the lower surface 62 of the radially outwardly directed lip 54 on the housing 52. Next, the actuator stack 42 is inserted into the housing 52 and the latter is pulled up over the stack towards the top seal 48. As the stack 42 is inserted further into the housing 52, the top seal 48 enters the aperture defined by the annular collar 56 such that, when the stack 42 is fully inserted into the housing 52 and abuts with the closed end 53 thereof, the collar 56 surrounds at least a portion of the top seal 48. This is the configuration of the stack 42 shown in FIG. 4.

As can be best seen in FIG. 3, since the housing 52 is shorter than the body of the stack 42 by a predetermined amount x it will be appreciated that, when the stack 42 is fully inserted into the housing 52 as described in the preceding paragraph, the upper surface 64 of the radially outwardly directed lip 54 is spaced from the lower surface 66 of the top seal 48 by a corresponding amount x. In this position, there is substantially no compressive load on the actuator stack 42.

To apply the desired compressive load to the stack (an operation known as "pre-stressing"), the housing 52 is then stretched over the stack 42 by suitable mechanical means until the upper surface 64 of the radially outwardly directed lip 54 abuts with the lower surface 66 of the top seal 48. It will be understood from the foregoing that in stretching the housing 52 over the stack 42, the top seal 48 is effectively inserted further into the aperture defined by the collar 56 by a distance substantially equal to x.

The housing 52 is then fixed or secured in position relative to the collar 56 by welding or otherwise bonding the collar 56 to the top seal 48. This fixing can be achieved by spot welding, laser welding or any other suitable metal-to-metal bonding methods.

In practice, it is envisaged that the operation of stretching the housing 52 over the stack 42 may be suitably achieved by inserting the partly assembled actuator 40 into a fixture ring or cylindrical recess, defining a fixed bearing surface (represented by the dashed line 70 in FIG. 3) which abuts with the lower surface 68 of the collar 56, and applying a compressive force to the top seal 48. This compressive force or loading effectively pushes the collar 56 and the radially outwardly directed lip 54 further towards the top seal 48, thereby stretching the housing 52 over the piezoelectric stack 42. When the predetermined distance x has been reduced substantially to zero, such that the upper surface 64 of the radially outwardly directed lip 54 abuts with the lower surface 66 of the top seal 48, the collar 56 is secured in position relative to the top seal 48.

The elastic strain induced in the housing 52 by this pre-stressing action generates a compressive load on the stack 42 which is effectively squeezed between the closed end 53 of the housing 52 and the top seal 48. This compressive load on the stack 42 is maintained by fixing the collar 56 to the top seal 48 as described above. In this way, the piezoelectric stack 42 is subjected to a compressive load at all times which, as previously identified, advantageously influences the performance and durability of the actuator.

In use, when the voltage applied across the electrodes 50 is appropriately reduced, the piezoelectric stack 42 reduces in length in the conventional manner. As described above, this reduction in length of the stack permits the valve needle 14 in the injector 10 to lift from its seating 16 under the pressure of fuel within the delivery chamber 18, thereby to permit delivery of fuel from the injector 10, through the outlet openings 32 and into the combustion space of the associated engine. It will be appreciated, therefore, that the actuator of the invention operates in a conventional manner.

The elastic strain induced in the housing 52 by virtue of its being stretched over the stack 42 is sufficient to maintain the stack 42 in compression even when the length of the stack is reduced. In this way, a compressive load is applied to the stack 42 substantially throughout the operating cycle of the injector 10. This may be achieved by selecting a distance x that is greater than the reduction in length of the stack on application of the voltage thereto.

In selecting an appropriate distance x it is necessary to consider the maximum stack length the actuator adopts in use (i.e. its most extended length), since additional stretching of the housing 52 beyond this amount may cause fatigue failure of the welds, or the material of the housing 52 itself.

It follows from the above that the amount of strain induced in the housing 52, and thus the compressive load applied to the stack 42, is dependent upon the spacing between the outwardly directed lip 54 and the lower surface 66 of the top seal 48 prior to compressive loading, i.e. the distance x. Changing the distance x, by altering the relative natural lengths of the housing 52 and the stack 42, for example, results in a change in the magnitude of strain induced in the stack 42. Increasing the distance x, for example, increases the strain induced in the housing 52, whilst reducing the distance x decreases the strain induced in the housing 52. The distance x can therefore be selected as desired.

Figure 5:
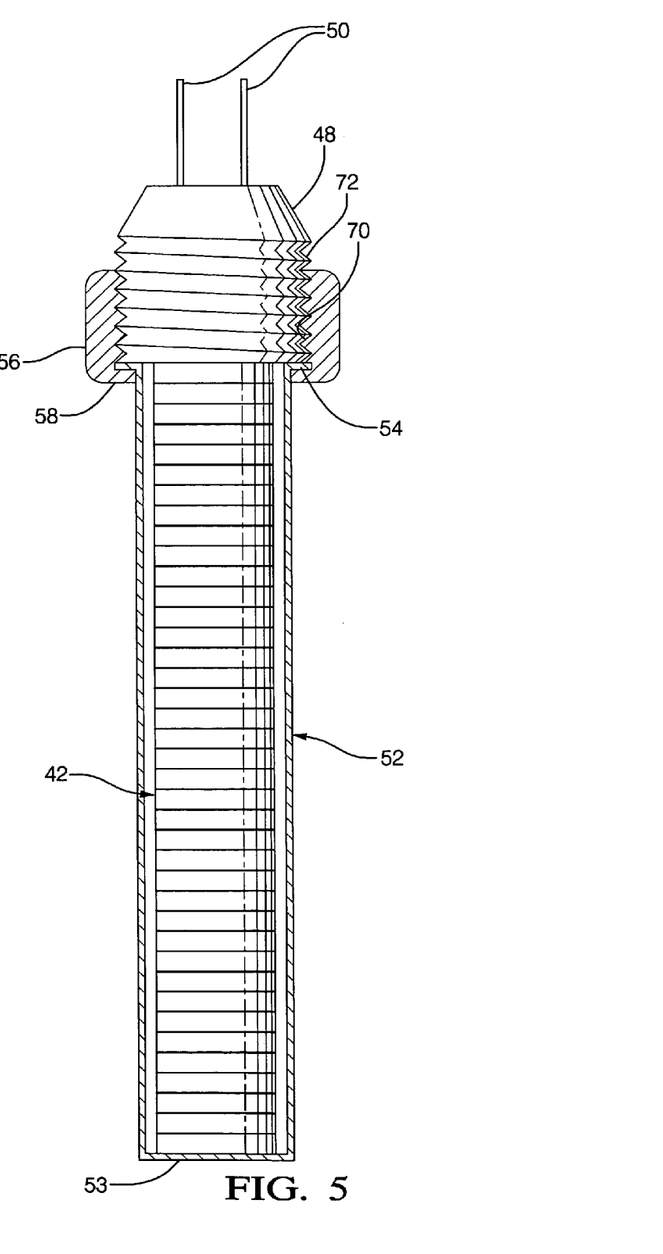
FIG. 5 illustrates a section through a piezoelectric actuator embodying a second form of the invention in a fully assembled state.

Referring next to FIG. 5, this illustrates a cross section through an actuator embodying a second form of the invention and in which like reference numerals indicate like parts to those described previously. In this embodiment, the internal surface 70 of the collar 56, excluding the lip 58, and the outer surface 72 of the top seal 48 are provided with a cooperating screw thread. All other components or features are substantially identical to the embodiment illustrated in FIG. 2.

The actuator of FIG. 5 is thus assembled in a similar manner to the actuator of FIG. 2 with the exception that, when the stack 42 has been inserted into the housing 52 by a certain amount, the collar 56 and the top seal 48 are able to be threadedly engaged with one another.

Thereafter, rotation of the collar 56 relative to the top seal 48 causes further threaded engagement thereof which has the effect of drawing the housing 52 over the stack 42 until a point is reached at which the end of the stack 42 abuts the closed end 53 of the housing 52. As in the embodiment of FIG. 2, at this position there is substantially no compressive load applied to the stack 42.

Further rotation of the collar 56 relative to the top seal 48 causes the housing 52 to be stretched over the stack 42 until the upper surface 64 of the radially outwardly directed lip 54 engages with the lower surface 66 of the top seal 48 and the desired elastic strain has been induced in the housing 52.

To prevent unthreading of the collar 56 from the top seal 48, which may result in a reduction in the compressive load applied to the stack 42, the collar 56 may be spot-welded or otherwise fixed in position relative to the top seal 48.

Figure 6:
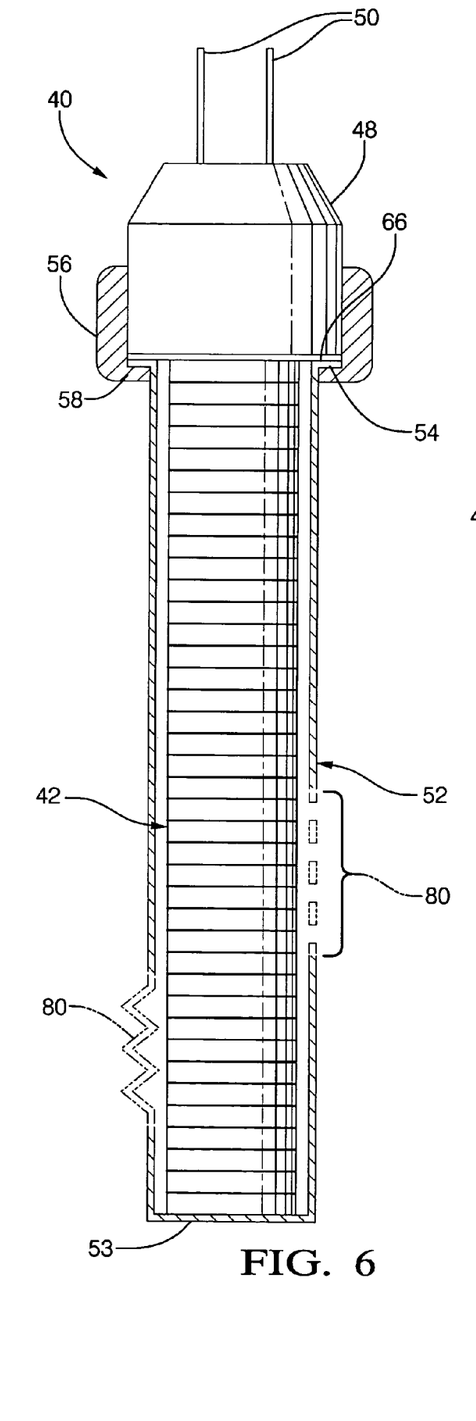
FIG. 6 illustrates a section through a piezoelectric actuator embodying a further alternative form of the invention in a partially assembled state.

Referring finally to FIG. 6, an actuator embodying an alternative form of the invention is shown, again in cross section, in a partially assembled state. In this embodiment also like reference numerals indicate like parts.

It will be understood by those skilled in the art that the elastic strain induced in the housing 52, and hence the compressive load applied to the stack 42, is not dependent solely on the distance x but is also determined by the elastic properties, such as spring rate or elastic modulus, of the material from which the housing is formed. While such properties can be imparted to the material at a molecular level, mechanical features can also be introduced into the housing 52 to affect the spring rate thereof. FIG. 6 illustrates a number of features which enable the spring rate, and hence elastic strain, of the housing to be controlled and modified.

For example, the housing 52 may be provided with one or more circumferential slots 80 extending partially around the housing 52 at discrete locations along the length thereof. The presence of the slots 80 increases the elasticity of the housing 52 and thus reduces the elastic strain induced therein.

Alternatively, or in addition, the housing 52 may be provided with one or more corrugated regions 82, which may otherwise be termed convolutions or undulations, extending circumferentially around the housing 52. Again, the corrugated regions 82 act in a similar manner to a tension spring and thus increase the elasticity of the housing 52 and reduce the elastic strain induced therein.

Figure 7:
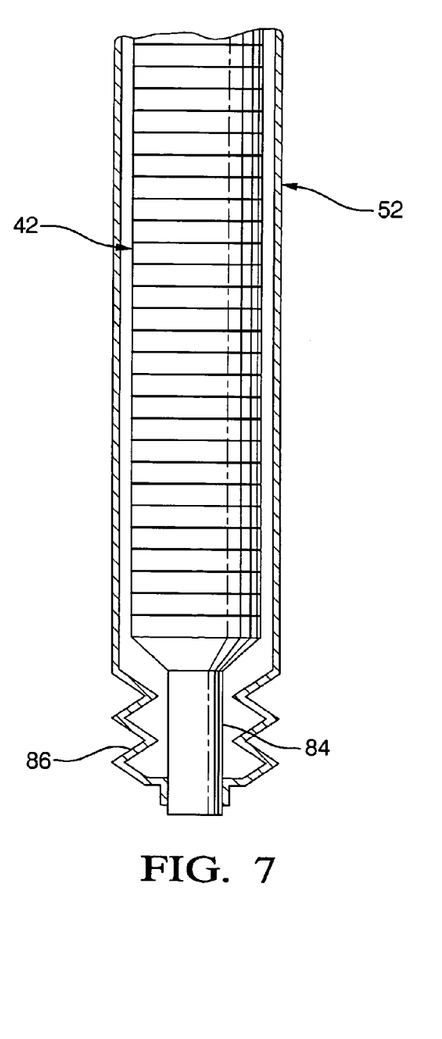
FIG. 7 is a schematic view of a part of a piezoelectric actuator embodying a further alternative embodiment of the invention.

A further alternative embodiment of the invention is shown in FIG. 7, in which the stack 42 is provided with a metallic end piece 84 at its lower end. The housing 52 is provided with an integral tension spring 86 defined by a region of corrugation. The tension spring 86 pulls on the lower end of the stack 42, via the metallic end piece 84, to keep the stack 42 under compression. It is an advantageous feature of providing the metallic end piece 84 on the stack that it can be made of reduced diameter so as to allow an increased space for the tension spring 86 of the housing 52. This gives greater freedom in selecting the spring properties.

It will be appreciated that the present invention provides a particularly simple yet highly effective solution to the problem of actuator stack compression. By providing a pre-stressing force on the actuator stack 42, the performance and durability of the actuator is significantly improved. Furthermore, this is achieved in a simple and inexpensive manner by using a conventional housing, normally used to prevent damage to the stack, to provide the compressive load to the stack. The actuator may be utilised in a fuel injector of both the energise-to-extend type and the de-energise-to-contract type, providing of course that the maximum length of the stack 42 is at all times accommodated by the housing 52.

Various modifications may also be made to the arrangement of the invention, as discussed below. For example, the top seal 48 may be formed from a metallic material or, alternatively, from a ceramic material. To enable welding compatibility with the collar 56, the top seal 48 may be surrounded by, or encased in, a metal sleeve 90, as shown in FIG. 6. The sleeve 90 could have either a generally smooth outer surface for use with the embodiment of FIG. 2, wherein the collar 56 is welded to the top seal 48. Alternatively, the outer surface of the sleeve 90 could be provided with a screw thread, for use in the embodiment of FIG. 5, wherein the top seal 48 is threadedly engaged with the collar 56.

The use of a ceramic top seal and metal sleeve has a number of advantages, providing an ability to utilise different materials for the housing 52 without any consideration for welding compatibility with the collar 56 and the top seal 48. There is therefore greater freedom to select the most appropriate materials and weld type for improving weld quality and durability.

This arrangement also permits a flexible approach to the selection of material for the housing 52. For example, heat treated titanium having a low elastic modulus may be used. The design permits fabrication and heat treatment of the housing 52, prior to actuator assembly, in order to obtain suitable material properties, such as increased strength. Since no welding occurs directly to the housing, it does not affect the material properties of the housing itself.

In addition, welding the metal sleeve 90 (or the top seal 48) to the collar 56, rather than directly to the housing 52, moves the weld to a location where it is not subjected to the billions of cycles of cyclic strain experienced by the housing itself, thus further improving durability.

As a further advantage of the invention, the housing 52 may provide a suitable encapsulant for the actuator stack 42, thereby sealing the stack 42 from the surrounding fuel within the injector accumulator volume 25. This is a considerable advantage since any fuel coming into contact with the actuator stack 42 cause it to fail.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

What is claimed is:

1. An actuator for a fuel injector, the actuator comprising a piezoelectric stack, wherein the piezoelectric stack consists of a plurality of layers of piezoelectric or piezoceramic material interspersed with a plurality of layers of electrically conductive material and connecting means for connecting said layers of electrically conductive material to a source of electrical power, wherein the connecting means comprises a cap or top seal which is fixed to one end of the piezoelectric stack.

2. An actuator as claimed in claim 1 piezoelectric stack disposed within a housing, wherein the housing is arranged to apply a compressive load to the piezoelectric stack.

3. An actuator as claimed in claim 2, wherein the housing comprises a generally cylindrical tube, the tube being closed at one end thereof.

4. An actuator as claimed in claim 1, wherein the top seal is formed from a ceramic material and bonded to one end of the piezoelectric stack.

5. An actuator as claimed in claim 1, wherein the top seal is formed from a metallic material and is bonded or welded to one end of the piezoelectric stack.

6. An actuator as claimed in claim 1, wherein the housing includes a radially outwardly directed lip or rim disposed circumferentially around an open end thereof.

7. An actuator as claimed in claim 6, wherein the housing has a length which is shorter than the length of the piezoelectric stack by a predetermined amount.

8. An actuator as claimed in claim 7, further comprising clamping means for clamping the lip to the top seal.

9. An actuator as claimed in claim 8, the arrangement being such that when the lip is clamped to the top seal the housing is stretched over the piezoelectric stack thereby to induce an elastic strain in the housing so as to apply the compressive load to the piezoelectric stack.

10. An actuator as claimed in claim 8, wherein the clamping means comprises a collar having a radially inwardly directed rim or lip for engagement with the radially outwardly directed lip, said clamping means further comprising means for fixing the collar to the top seal thereby to clamp the housing to the top seal.

11. An actuator as claimed in claim 10, wherein the means for fixing comprises a surface for welding the collar to the top seal.

12. An actuator as claimed in claim 10, wherein an external surface of the top seal includes or defines a screw thread and wherein the means for fixing comprises a threaded portion disposed on an internal surface of the collar for threaded engagement with the screw tread.

13. An actuator as claimed in claim 2, wherein the housing is provided with resilient means for inducing a predetermined elastic strain therein.

14. An actuator as claimed in claim 13, wherein the resilient means comprises one or more slots extending partially around the circumference of the housing.

15. An actuator as claimed in claim 13, wherein the resilient means comprises a corrugated region of the housing.

16. An actuator as claimed in claim 15, wherein the corrugated region forms a tension spring at a lower end of the housing, and wherein the stack is provided with an end piece which projects through the housing at the lower end thereof so that the tension spring serves to draw the stack into compression.

17. An actuator as claimed in claims 2, wherein the housing additionally provides an encapsulant for the stack to seal the stack against fluid pressure, in use.

18. A piezoelectrically operable fuel injector for use in an internal combustion engine, the fuel injector including an accumulator volume for pressurised fluid and a piezoelectric actuator as claimed in any one of claims 2 to 17, wherein the stack of the piezoelectric actuator is located within the accumulator volume.

* * * * *